United States Patent
Sun et al.

(10) Patent No.: US 10,392,256 B2
(45) Date of Patent: Aug. 27, 2019

(54) METHOD FOR PREPARING GRAPHENE BY USING MOLTEN INORGANIC SALT REACTION BED

(71) Applicant: Xuyang Sun, Jiaxing (CN)

(72) Inventors: Xuyang Sun, Jiaxing (CN); Yanchen Wang, Jiaxing (CN); Guoxiu Dong, Jiaxing (CN)

(73) Assignee: Xuyang Sun, Jiaxing (CN)

( * ) Notice: Subject to any disclaimer, the term of this patent is extended or adjusted under 35 U.S.C. 154(b) by 356 days.

(21) Appl. No.: 15/525,070

(22) PCT Filed: Nov. 7, 2014

(86) PCT No.: PCT/CN2014/090538
§ 371 (c)(1),
(2) Date: May 7, 2017

(87) PCT Pub. No.: WO2016/070396
PCT Pub. Date: Dec. 5, 2016

(65) Prior Publication Data
US 2018/0282161 A1 Oct. 4, 2018

(51) Int. Cl.
*C01B 32/184* (2017.01)
*C30B 9/12* (2006.01)
(Continued)

(52) U.S. Cl.
CPC .............. *C01B 32/184* (2017.08); *C30B 9/12* (2013.01); *B82Y 30/00* (2013.01); *B82Y 40/00* (2013.01);
(Continued)

(58) Field of Classification Search
CPC .......... C01B 32/184; C30B 9/12; C30B 29/02; B82Y 30/00; B82Y 40/00; Y10S 977/842; Y10S 977/734
See application file for complete search history.

(56) References Cited

U.S. PATENT DOCUMENTS

2011/0104507 A1  5/2011  Choi et al.

FOREIGN PATENT DOCUMENTS

| CN | 103588195 | * | 2/2014 | ............ C01B 31/04 |
| CN | 103663441 | * | 3/2014 | ............ C01B 31/04 |

(Continued)

OTHER PUBLICATIONS

Xue, et al., A simple approach towards nitrogen-doped graphene and metal/graphene by solid-state pyrolysis of metal phthalocyanine, New J. Chem. 2014; 38: 2993-2998 (Year: 2014).*

*Primary Examiner* — Daniel C. McCracken
(74) *Attorney, Agent, or Firm* — Platinum Intellectual Property LLP

(57) ABSTRACT

The present invention provides a method for preparing graphene by using a molten inorganic salt reaction bed. The method includes the following steps: using phthalocyanine substance as a reaction raw material, well-mixing an inorganic salt with the phthalocyanine substance in the inorganic salt reaction bed, performing pyrolysis by using a temperature programmed method in an atmosphere furnace under a protective gas, and separating out a highly planar-oriented graphene material. By adopting the method, a graphene material can be obtained by pyrolysis in a non-hydrogen environment. The method is simple, the process is environmentally friendly, industrial production can be achieved, and the obtained graphene is highly planar-oriented.

10 Claims, 3 Drawing Sheets

Molecular Structure

(51) Int. Cl.
  *B82Y 30/00* (2011.01)
  *B82Y 40/00* (2011.01)
  *C30B 29/02* (2006.01)

(52) U.S. Cl.
  CPC ........... *C30B 29/02* (2013.01); *Y10S 977/734* (2013.01); *Y10S 977/842* (2013.01)

(56) References Cited

FOREIGN PATENT DOCUMENTS

| | | | | |
|---|---|---|---|---|
| CN | 104445160 | * | 3/2015 | ........... C01B 32/184 |
| KR | 20130042985 | * | 4/2013 | ............. C01B 31/02 |
| WO | 2014128316 A1 | | 8/2014 | |

\* cited by examiner

Molecular Structure

METHOD FOR PREPARING GRAPHENE BY USING MOLTEN INORGANIC SALT REACTION BED

FIELD OF THE INVENTION

The present invention relates to the field of preparation of new materials, and in particular to a method for preparing a graphene material.

BACKGROUND OF THE INVENTION

Since 2004 Geim et al. prepared graphene by repeatedly stripping the graphene off natural graphite using an adhesive tape, graphene has caused an unprecedented sensation in the scientific community due to its unique monolayer lamellar hexagonal honeycomb lattice structure, and its unique excellent performance and great potential application value have attracted extensive attention around the world. In the chemical bonding mode, carbon atoms constituting the two-dimensional structure of the graphene are hybridized in a $sp^2$ mode, which makes the carbon atoms form a stable C—C bond with three adjacent carbon atoms through an a bond, thereby enabling the graphene to have very high mechanical properties. At the same time, $\pi$ electrons provided by a large number of carbon atoms perpendicular to the plane of the graphene form a large $\pi$ bond, and electrons can move freely therein, so the graphene usually has excellent conductivity. For example, the graphene is a zero-bandgap semiconductor, the moving speeds of the electrons therein can be up to 1/300 of the velocity of light, and the migration rate of graphene carriers is up to $2\times10^5$ $cm^2 \cdot V^{-1} \cdot S^{-1}$ and so on. In addition, the graphene also has good thermal and magnetic properties. Due to its higher specific surface area, the graphene has huge potential applications in the fields of supercapacitors, hydrogen storage, monomolecular chemical sensors, etc.

At present, the graphite oxide reduction method is the main method for preparing the graphene. The method includes: performing strong oxidation treatment on graphite to obtain graphene oxide, then stripping off the graphene oxide to prepare the graphene oxide, and finally performing a reduction treatment to obtain the graphene. Since the structure of the a graphene sheet layer can be seriously damaged during the strong oxidation process, although the electronic conjugate structure of the graphene sheet layer is partially restored after the reduction treatment, various performance indexes of the prepared graphene material still have greater difference as compared with high-quality graphene. In addition, the oxidation process of the graphite usually requires a large amount of strong acid oxidants, such as concentrated sulfuric acid, concentrated nitric acid, potassium permanganate and the like, and hydrazine hydrate or sodium borohydride and other toxic chemicals are also needed in the reduction process, thereby not only resulting in high energy consumption, low efficiency and high cost, but also leading to serious pollution, as in invention patents CN102897756, CN102897757 and so on. If the graphene is prepared by an epitaxial growth method, a carbon source gas (methane, ethane, acetylene or the like) needs to be injected at a high temperature, the gas decomposes and forms the graphene on a substrate, this method requires a high temperature that is higher than 1000° C., and hydrogen is needed to serve as a reducing gas, the requirements on production conditions are strict, the reaction time is long, the yield is low, and the use of a large number of dangerous gases increases the production cost and also limits the further application of the graphene. Moreover, it is very difficult to strip off the graphene from the substrate (such as copper, nickel, silicon carbide and other substrates), strong acid corrosion, high temperature gasification and other extreme methods are usually adopted, thereby not only leading to high cost and environmental pollution, but also damaging a finished product of the graphene, as in invention patents CN102903616, CN102891074 and so on.

Because of this special structure, the graphene has excellent physical and chemical properties, and how to use it in macrostructures or functional materials becomes the focus of attention in the scientific community at present. However, due to the poor dispersion of the graphene in a matrix, it is difficult to achieve uniformity; and moreover, since it is generally difficult for the graphene to form strong interface combination with the matrix, it becomes a difficulty in the development of graphene composite materials.

The graphene with orientated growth and uniform distribution can be designed and prepared into oriented graphene arrays in various shapes according to requirement. In applications, the problem of difficult dispersion can be avoided effectively, and the excellent performance of the graphene along the plane can be fully utilized, therefore the graphene has a broad application prospect.

Therefore, there is an urgent need to develop a method, which uses novel raw materials, is simple and feasible in method, has no special requirement on equipment, and is low in cost, high in efficiency, free of pollution, free of emission, and easy to popularize and use, and by means of which the problems of high cost, low efficiency, poor quality, poor dispersion, poor compatibility and the like in the existing graphene preparation technology can be solved, and a highly planar oriented graphene material can be obtained.

SUMMARY OF THE INVENTION

In view of the shortcomings in the prior art, a method for preparing graphene by using a molten inorganic salt reaction bed is provided.

To achieve the above-mentioned objective, the present invention adopts the following technical solutions:

A method for preparing graphene by using a molten inorganic salt reaction bed includes the following steps: using phthalocyanine substance as a reaction raw material, well-mixing an inorganic salt with the phthalocyanine substance in an inorganic salt reaction bed, performing pyrolysis by using a temperature programmed method in an atmosphere furnace under a protective gas, and separating out a highly planar-oriented graphene material.

In a further embodiment, the phthalocyanine substance includes nonmetal phthalocyanines, metal phthalocyanines, metallic oxide phthalocyanines, macromolecules containing phthalocyanine ring structures and porphyrin polymers containing phthalocyanine ring structures.

In a further embodiment, the inorganic salt reaction bed is obtained by filling inorganic salt in a high temperature resistant container; and the inorganic salt is one or more substances selected from sodium salt, potassium salt, sulfate, hydrochloride or nitrate.

In a further embodiment, the mass ratio of the phthalocyanine raw material to the inorganic salt is 1:99 to 10:90.

In a further embodiment, the method for well-mixing the inorganic salt with the reaction raw material includes: well-mixing the phthalocyanine substance with the inorganic salt before temperature rising, or uniformly adding the phthalocyanine substance into the inorganic salt reaction bed after the inorganic salt melted.

In a further embodiment, the protective gas is selected from nitrogen gas, argon gas, argon/hydrogen gas mixture, argon/ammonia gas mixture, nitrogen/hydrogen gas mixture or nitrogen/ammonia gas mixture, and the flow rate of the protective gas is controlled within 10-50 $cm^3 \cdot mm^{-1}$.

In another related embodiment, the volume ratio of the gas mixture is 0.1:9.9 to 1:9.

In a further embodiment, pyrolysis temperature is 800-1000° C., and pyrolysis time is 4-24 h.

In a further embodiment, the pyrolysis reaction can be performed in the absence of a catalyst or in the presence of a metal catalyst, and the metal catalyst is selected from a copper foil, a copper mesh, a nickel foil, foam nickel, a copper alloy or a nickel alloy.

In a further embodiment, high-quality graphene seed crystals are added to the inorganic salt or the phthalocyanine substance.

According to the method for preparing the graphene provided by the present invention, the phthalocyanine substance is used as the raw material, the molten inorganic salt reaction bed is used as the reaction bed, and the graphene material is prepared in one step by adopting the pyrolysis and precipitation technology. In the present invention, the graphene material can be obtained by pyrolysis in a non-hydrogen environment, the method is simple, the process is environmentally friendly, industrial production can be achieved, and the obtained graphene is highly planar-oriented, and the method can be applied to unimolecular detection technology, field-effect transistors and integrated circuits thereof, transparent conductive electrodes, conductive ink, field emission sources and vacuum electronic devices thereof, supercapacitors, biological devices, etc.

DETAILED DESCRIPTION OF THE EMBODIMENTS

Figure 1:
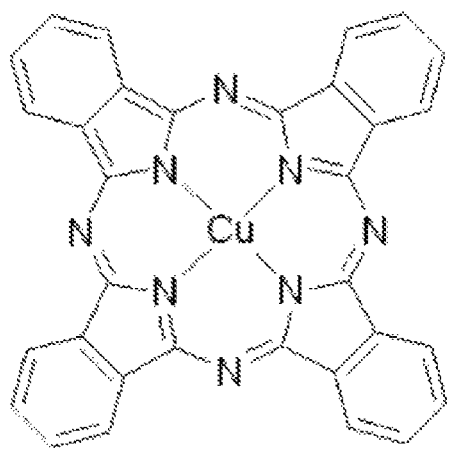
FIG. 1 is a schematic diagram of a molecular structure of phthalocyanine provided by an embodiment of the present invention.

A method for preparing graphene by using a molten inorganic salt reaction bed includes the following steps: using phthalocyanine substance as a reaction raw material (which is directly used without performing other raw material purification treatment), well-mixing an inorganic salt with the reaction raw material in the inorganic salt reaction bed, wherein the mixing mass ratio of the phthalocyanine raw material to the inorganic salt is 1:99 to 10:90, performing pyrolysis by using a temperature programmed method in an atmosphere furnace under a protective gas in the absence of a catalyst or in the presence of a metal catalyst with reference to the thermochemical properties of the raw material and by means of the high temperature heat transfer of the molten salt, and separating out a highly planar-oriented graphene material.

The phthalocyanine substance includes nonmetal phthalocyanines, metal phthalocyanines, metallic oxide phthalocyanines, macromolecules containing phthalocyanine ring structures and porphyrin polymers containing phthalocyanine ring structures. Any one of transition metal phthalocyanine compounds and derivatives thereof (e.g., nickel phthalocyanine, copper phthalocyanine, iron phthalocyanine, molybdenum phthalocyanine, cobalt phthalocyanine, gold phthalocyanine, or silver phthalocyanine and derivatives thereof and the like) is preferred.

The inorganic salt reaction bed is obtained by filling inorganic salt in a high temperature resistant container; and the inorganic salt is one and more substances selected from sodium salt, potassium salt, sulfate, hydrochloride or nitrate.

The method for well-mixing the inorganic salt with the reaction raw material includes: well-mixing the phthalocyanine substance with the inorganic salt before temperature rising, or uniformly adding the phthalocyanine substance into the inorganic salt reaction bed after the inorganic salt melted.

The protective gas is selected from nitrogen gas, argon gas, argon/hydrogen gas mixture, argon/ammonia gas mixture, nitrogen/hydrogen gas mixture or nitrogen/ammonia gas mixture. The volume ratio of the gas mixture is 0.1:9.9 to 1:9, and the flow rate of the protective gas is controlled within 10-50 $cm^3 \cdot min^{-1}$.

The pyrolysis temperature varies according to the thermochemical properties of the raw material, and is usually higher than 800° C., preferably, the pyrolysis temperature is 800-1000° C. At the preferred pyrolysis temperature, the pyrolysis time for generating a graphene sheet is 4-24 h, and if the pyrolysis time is shortened or prolonged, the size, the thickness and the quality of the final graphene material are affected. The pyrolysis reaction can be performed in the absence of a catalyst or in the presence of a metal catalyst, and the metal catalyst is selected from a copper foil, a copper mesh, a nickel foil, foam nickel, a copper alloy or a nickel alloy.

High-quality graphene seed crystals are added to the inorganic salt or the phthalocyanine substance, and the growth quality and speed of the graphene will be improved.

The size, the thickness and the quality of the graphene material can be effectively controlled by adjusting the pyrolysis temperature, the gas flow, the gas flow rate and other experimental parameters; different temperature programmed solutions are formulated for different raw materials according to the thermochemical properties thereof; and any compounds containing phthalocyanine rings and derivatives thereof can be used as the raw materials for obtaining nitrogen-doped graphene, metal graphene and graphene.

A nitrogen element in a aza-graphene material is obtained from nitrogen atoms in a phthalocyanine skeleton, and if nitrogen atoms with a higher content are required, a gas mixture of ammonia gas and an inert gas can be injected in the pyrolysis process. In order to improve the electrical conductivity or other properties of the material, the ammonia gas can be injected to increase the final nitrogen content of the material. Metal nanoparticles in the graphene material containing the metal nanoparticles are obtained from the type of metal contained in the raw material, with copper phthalocyanine as an example, the graphene material containing metal copper nanoparticles is obtained at last.

Figure 2:
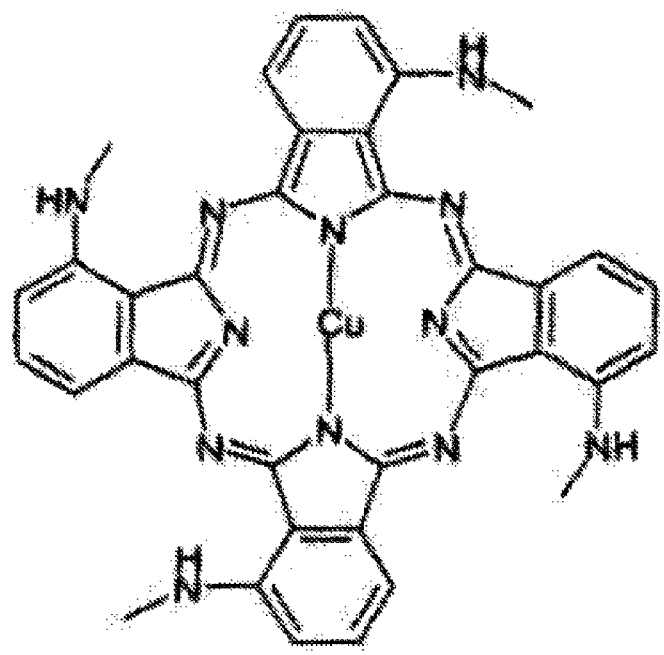
FIG. 2 is a macromolecular schematic diagram of single-layer polyphthalocyanine provided by an embodiment of the present invention.

Phthalocyanine is a kind of macrocyclic compounds. The molecular center of phthalocyanine is an 18-π system composed of carbon-nitrogen conjugated double bonds, there is a hollow cavity in the ring, and the diameter of the hollow cavity is about $2.7 \times 10^{-10}$ m. Two hydrogen atoms in the central cavity can be replaced by more than 70 elements, including almost all of metal elements and a part of non-metallic elements (as shown in FIG. 1), and metal oxides and the like. Phthalocyanine polymers refer to those macromolecules containing phthalocyanine ring structures (as shown in FIG. 2). In the present invention, the kind of compounds is used as the raw material, the molten salt is used as the reaction bed, and the graphene material is prepared in one step by adopting the pyrolysis and precipitation technology; and a carbon nano tube and fullerene can also be prepared by the method.

Example 1

Figure 3:
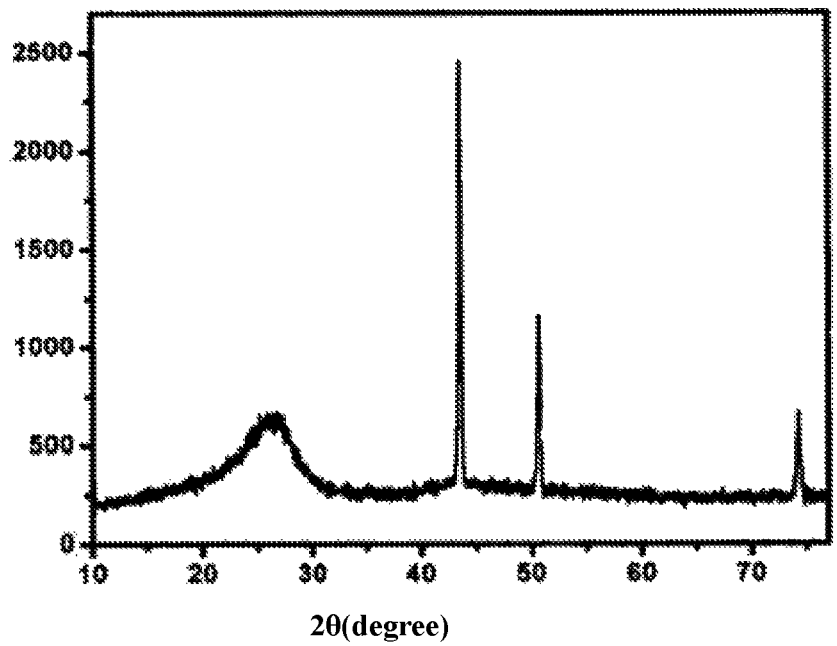
FIG. 3 is an XRD spectrum of an orientated graphene material obtained with sodium chloride as a medium provided by an embodiment of the present invention.
Figure 5:
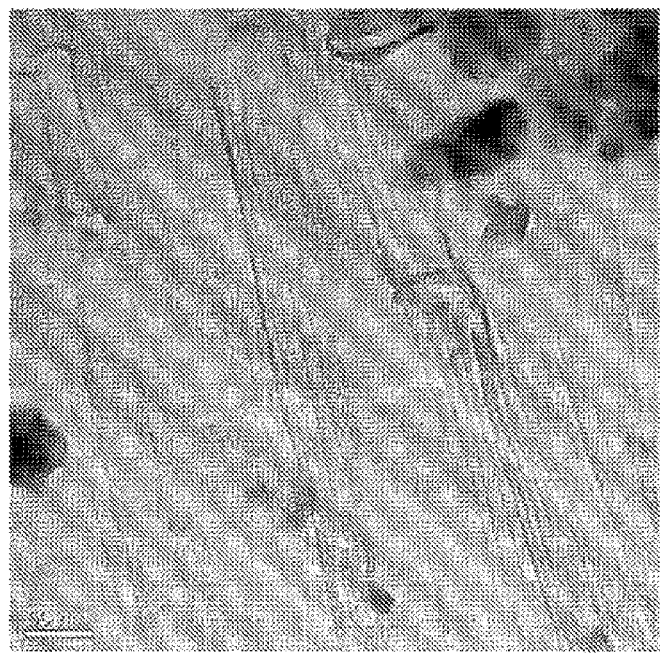
FIG. 5 is a transmission electron microscope (TEM) picture of an orientated graphene material obtained with sodium chloride as a medium provided by an embodiment of the present invention.

With 30.0 g of commercially available copper phthalocyanine (CuPc) as a raw material, no purification treatment is performed, which is well-mixed with sodium chloride, and the mass ratio of CuPc to sodium chloride is 1:99. In a quartz tube furnace, the flow rate of argon gas is controlled to 50 $cm^3 \cdot min^{-1}$ under the protection of high-purity argon gas, and pyrolysis is performed by the following temperature programmed solution to obtain 20.7 g of final metal graphene material: heating up to 300° C. at a slow temperature rise rate of 5° C. per minute, and stabilizing at 300° C. for 1 h; heating up to 350° C. at the temperature rise rate of 5° C. per minute, and stabilizing at 350° C. for 1 h; heating up to 400° C. at the temperature rise rate of 5° C. per minute, and stabilizing at 400° C. for 1 h; heating up to 500° C. at the temperature rise rate of 3° C. per minute, and stabilizing at 500° C. for 4 h; and heating up to 800° C. at the temperature rise rate of 2° C. per minute, stabilizing at 800° C. for 8 h, finally naturally cooling to the room temperature, and washing the product with water to remove the salt, thus obtaining a highly oriented graphene material, wherein an XRD spectrum and a transmission electron microscope spectrum thereof are as shown in FIG. 3 and FIG. 5.

Example 2

Figure 4:
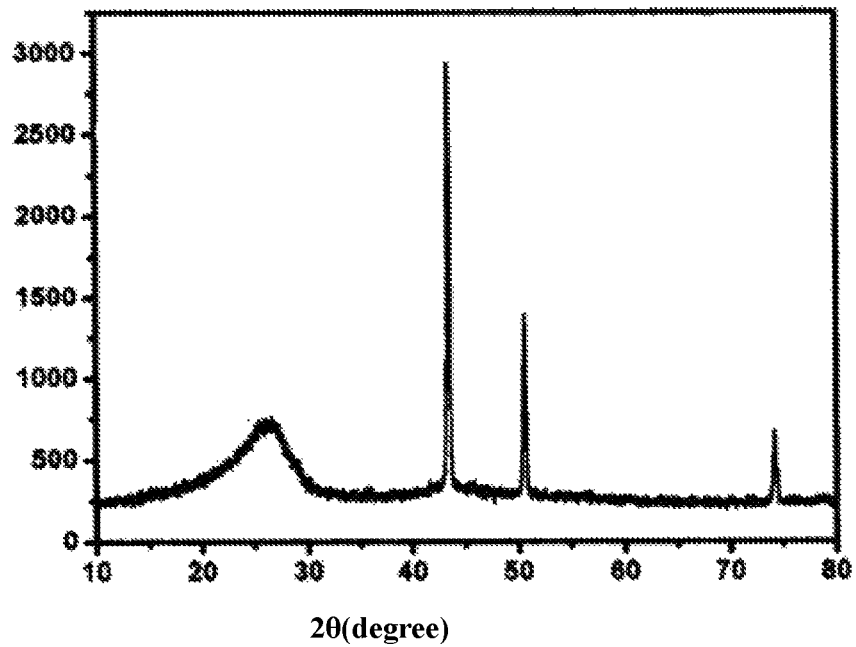
FIG. 4 is an XRD spectrum of an orientated graphene material obtained with potassium chloride as a medium provided by an embodiment of the present invention.
Figure 6:
FIG. 6 is a transmission electron microscope (TEM) picture of an orientated graphene material obtained with potassium chloride as a medium provided by an embodiment of the present invention.

With 30.0 g of commercially available copper phthalocyanine (CuPc) as a raw material, no purification treatment is performed, which is well-mixed with potassium chloride, and the mass ratio of CuPc to potassium chloride is 1:99. In a quartz tube furnace, the flow rate of argon gas is controlled to 50 $cm^3 \cdot min^{-1}$ under the protection of high-purity argon gas, and pyrolysis is performed by the following temperature programmed solution to obtain 20.7 g of final metal graphene material: heating up to 300° C. at a slow temperature rise rate of 5° C. per minute, and stabilizing at 300° C. for 1 h; heating up to 350° C. at the temperature rise rate of 5° C. per minute, and stabilizing at 350° C. for 1 h; heating up to 400° C. at the temperature rise rate of 5° C. per minute, and stabilizing at 400° C. for 1 h; heating up to 500° C. at the temperature rise rate of 3° C. per minute, and stabilizing at 500° C. for 4 h; and heating up to 800° C. at the temperature rise rate of 2° C. per minute, stabilizing at 800° C. for 8 h, finally naturally cooling to the room temperature, and washing the product with water to remove the salt, thus obtaining a highly oriented graphene material, wherein an XRD spectrum and a transmission electron microscope spectrum thereof are as shown in FIG. 4 and FIG. 6.

Example 3

With 30.0 g of commercially available copper phthalocyanine (CuPc) as a raw material, no purification treatment is performed, which is well-mixed with sodium chloride, and the mass ratio of CuPc to sodium chloride is 10:90. In a quartz tube furnace, the flow rate of argon gas is controlled to 50 $cm^3 \cdot min^{-1}$ under the protection of high-purity argon gas, and pyrolysis is performed by the following temperature programmed solution to obtain 20.7 g of final metal graphene material: heating up to 300° C. at a slow temperature rise rate of 5° C. per minute, and stabilizing at 300° C. for 1 h; heating up to 350° C. at the temperature rise rate of 5° C. per minute, and stabilizing at 350° C. for 1 h; heating up to 400° C. at the temperature rise rate of 5° C. per minute, and stabilizing at 400° C. for 1 h; heating up to 500° C. at the temperature rise rate of 3° C. per minute, and stabilizing at 500° C. for 4 h; and heating up to 800° C. at the temperature rise rate of 2° C. per minute, stabilizing at 800° C. for 8 h, finally naturally cooling to the room temperature, and washing the product with water to remove the salt, thus obtaining a highly oriented graphene material.

Example 4

With 30.0 g of commercially available copper phthalocyanine (CuPc) as a raw material, no purification treatment is performed, which is well-mixed with potassium chloride, and the mass ratio of CuPc to potassium chloride is 10:90. In a quartz tube furnace, the flow rate of argon gas is controlled to 50 $cm^3 \cdot min^{-1}$ under the protection of high-purity argon gas, and pyrolysis is performed by the following temperature programmed solution to obtain 20.7 g of final metal graphene material: heating up to 300° C. at a slow temperature rise rate of 5° C. per minute, and stabilizing at 300° C. for 1 h; heating up to 350° C. at the temperature rise rate of 5° C. per minute, and stabilizing at 350° C. for 1 h; heating up to 400° C. at the temperature rise rate of 5° C. per minute, and stabilizing at 400° C. for 1 h; heating up to 500° C. at the temperature rise rate of 3° C. per minute, and stabilizing at 500° C. for 4 h; and heating up to 800° C. at the temperature rise rate of 2° C. per minute, stabilizing at 800° C. for 8 h, finally naturally cooling to the room temperature, and washing the product with water to remove the salt, thus obtaining a highly oriented graphene material.

TABLE 1

Comparison of specific surface area of the graphene material obtained with proportions of different salts and raw materials under different salt media

| Example | Mass ratio of CuPc to salt | Specific surface area ($m^2 \cdot g^{-1}$) |
|---|---|---|
| 1 | CuPc:NaCl = 1:99 | 200.4 |
| 2 | CuPc:KCl = 1:99 | 290.8 |
| 3 | CuPc:NaCl = 10:90 | 38.5 |
| 4 | CuPc:KCl = 10:90 | 60.8 |

Example 5

With 30.0 g of nickel phthalocyanine (NiPc) synthesized in laboratory as a raw material, which is well-mixed with sodium chloride, and the mass ratio of NiPc to sodium chloride is 1:99. In a quartz tube furnace, the flow rate of argon gas is controlled to 50 cm$^3$·min$^{-1}$ under the protection of high-purity argon gas, and pyrolysis is performed by the following temperature programmed solution to obtain 20.7 g of final metal graphene material: heating up to 300° C. at a slow temperature rise rate of 5° C. per minute, and stabilizing at 300° C. for 1 h; heating up to 350° C. at the temperature rise rate of 5° C. per minute, and stabilizing at 350° C. for 1 h; heating up to 400° C. at the temperature rise rate of 5° C. per minute, and stabilizing at 400° C. for 1 h; heating up to 500° C. at the temperature rise rate of 3° C. per minute, and stabilizing at 500° C. for 4 h; and heating up to 800° C. at the temperature rise rate of 2° C. per minute, stabilizing at 800° C. for 8 h, finally naturally cooling to the room temperature, and washing the product with water to remove the salt, thus obtaining a highly oriented graphene material.

Example 6

With 30.0 g of nickel phthalocyanine (NiPc) synthesized in laboratory as a raw material, which is well-mixed with potassium chloride, and the mass ratio of NiPc to potassium chloride is 1:99. In a quartz tube furnace, the flow rate of argon gas is controlled to 50 cm$^3$·min$^{-1}$ under the protection of high-purity argon gas, and pyrolysis is performed by the following temperature programmed solution to obtain 20.7 g of final metal graphene material: heating up to 300° C. at a slow temperature rise rate of 5° C. per minute, and stabilizing at 300° C. for 1 h; heating up to 350° C. at the temperature rise rate of 5° C. per minute, and stabilizing at 350° C. for 1 h; heating up to 400° C. at the temperature rise rate of 5° C. per minute, and stabilizing at 400° C. for 1 h; heating up to 500° C. at the temperature rise rate of 3° C. per minute, and stabilizing at 500° C. for 4 h; and heating up to 800° C. at the temperature rise rate of 2° C. per minute, stabilizing at 800° C. for 8 h, finally naturally cooling to the room temperature, and washing the product with water to remove the salt, thus obtaining a highly oriented graphene material.

Example 7

With 30.0 g of nickel phthalocyanine (NiPc) synthesized in laboratory as a raw material, which is well-mixed with sodium chloride, and the mass ratio of NiPc to sodium chloride is 10:90. In a quartz tube furnace, the flow rate of argon gas is controlled to 50 cm$^3$·min$^{-1}$ under the protection of high-purity argon gas, and pyrolysis is performed by the following temperature programmed solution to obtain 20.7 g of final metal graphene material: heating up to 300° C. at a slow temperature rise rate of 5° C. per minute, and stabilizing at 300° C. for 1 h; heating up to 350° C. at the temperature rise rate of 5° C. per minute, and stabilizing at 350° C. for 1 h; heating up to 400° C. at the temperature rise rate of 5° C. per minute, and stabilizing at 400° C. for 1 h; heating up to 500° C. at the temperature rise rate of 3° C. per minute, and stabilizing at 500° C. for 4 h; and heating up to 800° C. at the temperature rise rate of 2° C. per minute, stabilizing at 800° C. for 8 h, finally naturally cooling to the room temperature, and washing the product with water to remove the salt, thus obtaining a highly oriented graphene material.

Example 8

With 30.0 g of nickel phthalocyanine (NiPc) synthesized in laboratory as a raw material, which is well-mixed with potassium chloride, and the mass ratio of NiPc to potassium chloride is 10:90. In a quartz tube furnace, the flow rate of argon gas is controlled to 50 cm$^3$·min$^{-1}$ under the protection of high-purity argon gas, and pyrolysis is performed by the following temperature programmed solution to obtain 20.7 g of final metal graphene material: heating up to 300° C. at a slow temperature rise rate of 5° C. per minute, and stabilizing at 300° C. for 1 h; heating up to 350° C. at the temperature rise rate of 5° C. per minute, and stabilizing at 350° C. for 1 h; heating up to 400° C. at the temperature rise rate of 5° C. per minute, and stabilizing at 400° C. for 1 h; heating up to 500° C. at the temperature rise rate of 3° C. per minute, and stabilizing at 500° C. for 4 h; and heating up to 800° C. at the temperature rise rate of 2° C. per minute, stabilizing at 800° C. for 8 h, finally naturally cooling to the room temperature, and washing the product with water to remove the salt, thus obtaining a highly oriented graphene material.

TABLE 2

Comparison of specific surface area of the graphene material obtained with proportions of different salts and raw materials under different salt media

| Example | Mass ratio of NiPc to salt | Specific surface area (m$^2$·g$^{-1}$) |
|---|---|---|
| 5 | NiPc:NaCl = 1:99 | 300.8 |
| 6 | NiPc:KCl = 1:99 | 490.8 |
| 7 | NiPc:NaCl = 10:90 | 88.5 |
| 8 | NPc:KCl = 10:90 | 80.8 |

Example 9

With 30.0 g of commercially available copper phthalocyanine (CuPc) as a raw material, no purification treatment is performed, which is well-mixed with sodium chloride, and the mass ratio of CuPc to sodium chloride is 1:99. In a quartz tube furnace, the flow rate of argon gas is controlled to 50 cm$^3$·min$^{-1}$ under the protection of high-purity argon gas, and pyrolysis is performed by the following temperature programmed solution to obtain 20.7 g of final metal graphene material: heating up to 300° C. at a slow temperature rise rate of 5° C. per minute, and stabilizing at 300° C. for 1 h; heating up to 350° C. at the temperature rise rate of 5° C. per minute, and stabilizing at 350° C. for 1 h; heating up to 400° C. at the temperature rise rate of 5° C. per minute, and stabilizing at 400° C. for 1 h; heating up to 500° C. at the temperature rise rate of 3° C. per minute, and stabilizing at 500° C. for 4 h; and heating up to 800° C. at the temperature rise rate of 2° C. per minute, stabilizing at 800° C. for 8 h, finally naturally cooling to the room temperature, and washing the product with water to remove the salt, thus obtaining a highly oriented graphene material with the specific surface area of 197.8 m$^2$·m$^{-1}$.

Example 10

With 30.0 g of commercially available copper phthalocyanine (CuPc) as a raw material, no purification treatment is performed, a small amount of graphene oxide seed crystals is added, CuPc is well-mixed with graphene oxide and sodium chloride, and successively the mass ratio of the three components is 1:1:98. In a quartz tube furnace, the flow rate of argon gas is controlled to 50 cm$^3$·min$^{-1}$ under the protection of high-purity argon gas, and pyrolysis is performed by the following temperature programmed solution to obtain 20.7 g of final metal graphene material: heating up to 300°

C. at a slow temperature rise rate of 5° C. per minute, and stabilizing at 300° C. for 1 h; heating up to 350° C. at the temperature rise rate of 5° C. per minute, and stabilizing at 350° C. for 1 h; heating up to 400° C. at the temperature rise rate of 5° C. per minute, and stabilizing at 400° C. for 1 h; heating up to 500° C. at the temperature rise rate of 3° C. per minute, and stabilizing at 500° C. for 4 h; and heating up to 800° C. at the temperature rise rate of 2° C. per minute, stabilizing at 800° C. for 8 h, finally naturally cooling to the room temperature, and washing the product with water to remove the salt, thus obtaining a highly oriented graphene material with the specific surface area of 210.8 $m^2 \cdot g^{-1}$.

COMPARISON EXAMPLE

A method for synthesizing aza-graphene in Chinese Invention Patent No. CN201110204957 includes the following steps: firstly cleaning and drying a substrate; coating the surface of the substrate with a solution containing a catalyst, wherein the catalyst is a water-soluble metal salt; and heating the substrate coated with the catalyst to 500-1300° C., injecting a reducing gas to reduce the catalyst, and then injecting a gaseous organic carbon source compound and a gaseous nitrogen source compound to react to obtain the aza-graphene, wherein the nitrogen doping amount is 3.7%.

Finally, it should be noted that the above-mentioned examples are merely used for illustrating the technical solutions of the present invention, rather than limiting them; although the present invention has been described in detail with reference to the examples, those of ordinary skill in the art should understand that they could still make modifications or equivalent substitutions to the technical solutions of the present invention without departing from the spirit and scope of the technical solutions of the present invention, and these modifications or equivalent substitutions shall all fall within the scope of the claims of the present invention.

The invention claimed is:

1. A method for preparing graphene by using a molten inorganic salt reaction bed, comprising the following steps:
using phthalocyanine substance as a reaction raw material, well-mixing an inorganic salt with the phthalocyanine substance in an inorganic salt reaction bed, performing pyrolysis by using a temperature programmed method in an atmosphere furnace under a protective gas, and separating out a highly planar-oriented graphene material.

2. The method of claim 1 wherein the phthalocyanine substance comprises nonmetal phthalocyanines, metal phthalocyanines, metallic oxide phthalocyanines, macromolecules containing phthalocyanine ring structures and porphyrin polymers containing phthalocyanine ring structures.

3. The method of claim 1 wherein the inorganic salt reaction bed is obtained by filling inorganic salt in a high temperature resistant container; and the inorganic salt is one or more substances selected from sodium salt, potassium salt, sulfate, hydrochloride or nitrate.

4. The method of claim 1 wherein the mass ratio of the phthalocyanine raw material to the inorganic salt is 1:99 to 10:90.

5. The method of claim 1 wherein the method for well-mixing the inorganic salt with the reaction raw material comprises: well-mixing the phthalocyanine substance with the inorganic salt before temperature rising, or uniformly adding the phthalocyanine substance into the inorganic salt reaction bed after the inorganic salt melted.

6. The method of claim 1 wherein the protective gas is selected from nitrogen gas, argon gas, argon/hydrogen gas mixture, argon/ammonia gas mixture, nitrogen/hydrogen gas mixture or nitrogen/ammonia gas mixture, and the flow rate of the protective gas is controlled within 10-50 $cm^3 \cdot min^{-1}$.

7. The method of claim 6 wherein the volume ratio of the gas mixture is 0.1:9.9 to 1:9.

8. The method of claim 1 wherein pyrolysis temperature is 800-1000° C., and pyrolysis time is 4-24 h.

9. The method of claim 1 wherein pyrolysis reaction can be performed in the absence of a catalyst or in the presence of a metal catalyst, and the metal catalyst is selected from a copper foil, a copper mesh, a nickel foil, foam nickel, a copper alloy or a nickel alloy.

10. The method of claim 1 wherein high-quality graphene seed crystals are added to the inorganic salt or the phthalocyanine substance.

* * * * *